United States Patent
Clairmont et al.

(10) Patent No.: US 6,725,237 B2
(45) Date of Patent: Apr. 20, 2004

(54) SYSTEM AND METHOD OF PREPARING DATA FOR A SEMICONDUCTOR MASK MANUFACTURER

(75) Inventors: James B. Clairmont, Williston, VT (US); Karen S. Edwards, Milton, VT (US); Darlene M. Ross, Milton, VT (US); Florence M. Sears, Crown Point, NY (US); Christopher S. Yager, Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 237 days.

(21) Appl. No.: 09/871,756

(22) Filed: Jun. 1, 2001

(65) Prior Publication Data

US 2003/0126153 A1 Jul. 3, 2003

(51) Int. Cl.[7] .................................................. G06F 17/30
(52) U.S. Cl. ...................... 707/104.1; 709/203; 713/201
(58) Field of Search ................................. 707/201, 202, 707/204, 1–10, 100, 104.1; 716/1, 2, 4, 5, 13, 14, 18; 709/203; 713/201

(56) References Cited

U.S. PATENT DOCUMENTS

| | | | | |
|---|---|---|---|---|
| 5,764,899 A | * | 6/1998 | Eggleston et al. | 709/203 |
| 5,910,986 A | * | 6/1999 | Dove | 713/155 |
| 5,937,160 A | * | 8/1999 | Davis et al. | 709/203 |
| 5,987,611 A | * | 11/1999 | Freund | 713/201 |
| 6,161,107 A | | 12/2000 | Stern | 707/104 |
| 6,185,726 B1 | * | 2/2001 | Chou | 716/18 |
| 6,336,056 B1 | * | 1/2002 | Fujimoto et al. | 700/121 |
| 2002/0144153 A1 | * | 10/2002 | LeVine et al. | 713/201 |
| 2003/0126153 A1 | * | 7/2003 | Clairmont et al. | 707/104.1 |

* cited by examiner

Primary Examiner—Charles Rones
(74) Attorney, Agent, or Firm—McGinn & Gibb, PLLC; Richard M. Kotulak, Esq.

(57) ABSTRACT

A system and method in a computing network for generating an integrated circuit (IC) tapeout file at a remote client workstation by transmitting prompted IC technical data to the mask manufacturer. The process validates that the tapeout file is complete and accurate prior to generating the final IC tapeout file to be archived in the mask manufacturer's database.

36 Claims, 4 Drawing Sheets

SYSTEM AND METHOD OF PREPARING DATA FOR A SEMICONDUCTOR MASK MANUFACTURER

BACKGROUND OF THE INVENTION

1. Field of the Invention

The present invention relates to a networked, technical data gathering and storing system. More specifically, the present invention relates to an integrated circuit technical data gathering system which provides a client with methods of gathering, editing and analyzing the technical data to produce a tapeout file for a mask.

2. Description of the Related Art

Conventional semiconductor mask manufacturing requires efficient design and testing of integrated circuits (IC) that is often an extremely complex and time-consuming task due to the large number of electrical components and separate electrical circuits contained in the integrated circuit chip. The complexity of the IC design procedure presents a substantial number of obstacles to successfully produce a final product that performs with minimal errors which is discussed in U.S. Pat. No. 6,185,726. Final steps of the IC design process prior to mask fabrication include creating and sending a packaged and complete IC chip design file. This is commonly referred to as "tapeout" file process, or "release information file" (RIF) process. The tapeout file is typically referenced and cataloged in an archival data base at the semiconductor manufacturer. The RIF is a text document that contains information pertaining to the technical data of an IC design being sent from a client to the mask manufacturer.

FIG. 1 shows one known "tapeout" process, which does not necessarily constitute prior art and may not be generally known to those ordinarily skilled in the art at the time of filing this application. This process includes a client 10 who sends a final tapeout file to the semiconductor mask manufacturer (MM) 20. During this process, a client packages "technical data" files that can exceed several gigabytes in size, which are manually sent via an electronic file transfer protocol (FTP). This process often has errors in the final tapeout file sent to the MM since data is frequently entered manually or electronically, and sent 15 without being checked or verified as a final "tapeout" file. Such events often result in the MM 20 having to check and reverify 17 data once received 18 by the MM. Normally, this requires that the MM check the data as to being complete and accurate. If not, the data is sent back to the client 16. When and if the tapeout is finalized, it is then FTP'd to the MM archival database 19 and normally an electronic-mail acknowledgment 21 is sent to the client.

There are many problems with this process. First, because there is no single and consistent method for sending the tapeout file to MM 18, a manual process has to be in place to review and verify 17 that the tapeout file is accurate. Second, this review process necessitates the need for a rework process 16 whereby the tapeout file can be sent back to the client to be corrected and then resent to MM where it will be reviewed again. Third, this process requires that the tapeout file be sent via FTP, a minimum of two times: first to MM 15 and second to the archival database 19. This increases each time the tapeout file is sent back through the rework process. These problems add labor, expense, cycle time and additional computer network traffic.

Thus, there is need for a system and method that minimizes manual intervention, and standardizes the gathering, editing, and analyzing of technical data related to producing a tapeout file that is complete, accurate and valid prior to archival storage by an MM.

SUMMARY OF THE INVENTION

In view of the foregoing and other problems, disadvantages, and drawbacks of the conventional tapeout process, the present invention has been devised, and it is an object of the present invention to provide a system and method which allow clients of a semiconductor mask manufacture (MM) to submit standardized technical data (e.g., design data, test data, design preparation instructions, etc.) from their workstation directly to the MM's archival data base, in a network process that gathers, edits and analyzes technical data of a particular IC design.

To attain these objectives according to one aspect of the invention, a networked system and method for clients is provided to communicate authenticated, validated and standardized technical data at a reduced expense. The invention automatically checks for accuracy and verifies a tapeout file at the client's workstation prior to sending to the MM server to be archived. The invention facilitates the sending of very large electronic files automatically using FTP format from a client's workstation to the MM, thus reducing by over half the volume of data transfers on the MM's network. Additionally, the invention reduces cycle time required to produce the tapeout file, which in turn also reduces expense in receiving, validating, and archiving a client's tapeout file. Thus, the method and system of the invention in a computing network generates an integrated circuit (IC) tapeout file at a remote client workstation and transmits prompted IC technical data to the MM. The process validates that the tapeout file is complete and accurate prior to generating the IC tapeout file and archiving in the MM's database.

BRIEF DESCRIPTION OF THE DRAWINGS

The foregoing and other objects, aspects and advantages will be better understood from the following detailed description of a preferred embodiment(s) of the invention with reference to the drawings, in which.

DETAILED DESCRIPTION OF PREFERRED EMBODIMENTS OF THE INVENTION

The system and method of the invention is a network-based computing system with Web-based applications, where a client of a semiconductor mask manufacturer (MM) can submit finalized "tapeout" files (i.e., technical data of a particular IC design such as design data, test data, design preparation instructions, etc.) from the client's workstation to the MM's archival data base. The invention automates this process. Note that a "tapeout" file is a package that includes the IC design technical data along with the "release information file" (RIF), which is a text document that contains information and instructions pertaining to the IC design technical data. The invention allows such files to be sent automatically on the MM network at completion without need for manual transfer. The invention performs the tapeout process in a formatted manner using a browser on the workstation, which cycles through a technical data interface application that prompts the client for all pertinent information regarding the technical data to be sent. Each page of this application as it is presented to the client is validated prior to final submission so that only complete and accurate RIFs are processed in the MM network. Information contained in this RIF technical data file (forming contents of the ultimate tapeout file for an IC design) can reside on either the client's workstation or on a shared file system.

Figure 2:
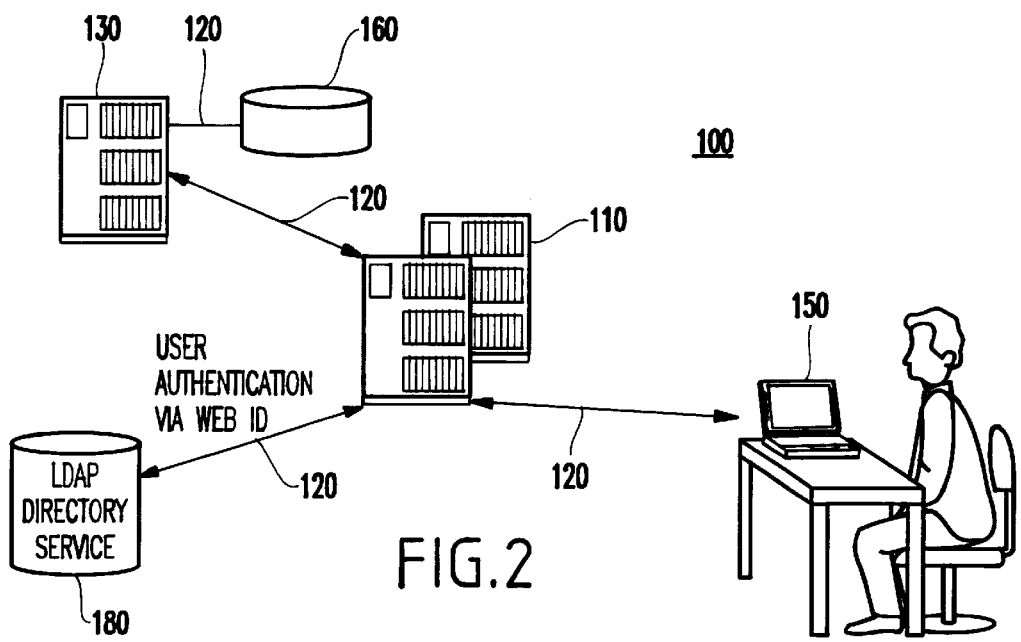
FIG. 2 shows hardware architecture according to the invention.

Referring now to FIG. 2, hardware and architecture for a MM system network 100 according to the present invention is shown in exemplary form. The MM computer network 100 includes at least one server 110 that is connected through multiple data transmission links 120. These data links are typically wireless links, optical fibers or standard wiring. The network 100 can be an intranet-based (LAN-based), Internet-based (URL-based), or extranet-based (WAN-based) linked network. At a typical MM's facility, the server 110 connects with multiple client workstations 150 (note that only one is shown for clarity) at remote sites. Also, the MM server 110 can be one or more servers that are interconnected at the MM facility. As shown, the MM's main server 110 is connected through the data links 120 to an archival server 130 that attaches to an archival database 160, which contains a library of referenced IC design data that is used to ultimately make a mask for IC fabrication. The preferred platform is a model RISC/6000 executing an operating system (e.g., either AIX, UNIX or LINUX) which runs an application server software such as IBM's WebSphere. (AIX, UNIX, or LINUX are registered trademarks of its respective corporate entity).

The client workstation 150 can be a personal computer (PC) or workstation that has a windowing-type operating system configured to run commercially-available graphical user interface (GUI) application such as the Microsoft Windows NT, IBM AIX or equivalent operating system in a network environment. Note that the operational capability of the GUI interface of the windowing system is fundamental to, but distinct from, the invention. The client workstation 150 typically is capable of supporting concurrent execution of a plurality of application programs such as a browser. These application programs are interfaced through a navigator function that is joined conventionally to the GUI. The GUI operating system is a software system which allows a client to directly manipulate the application programs by conventional I/O devices that include a CRT display, a keyboard, a mouse, or other user specified device in any combination. A file manager is also provided which opens, maintains, and closes files on behalf of the navigator function and the graphical user interface. The file manager operates in conjunction with one or more peripheral storage devices such as a direct access storage device (hard disk drive). The GUI operates conventionally as a windowing system well known in the software arts. One of the many advantages of such GUIs include quick and easy platforms for displaying frequently used or required data by selecting and manipulating graphical display elements, such as icons, with a pointing device, such as a mouse.

The browser can be Netscape's Navigator or Microsoft's Internet Explorer browser (Registered Trademarks of Netscape and Microsoft Corporations). The browser is an application configured on the workstation 150. The browser provides a "container" wherein multiple active applications operate that can use Sun Computer's Java programming language or Microsoft ActiveX/OCX "object" technology to implement application objects. It is understood, however, that application objects can be any application that meets the API specifications of the GUI.

These application objects may include CGI scripts, JAVA components, ActiveX components, and the like. As a result, objects are either linked or embedded into the browser from the MM server 110. When an object is linked from the server document to the container document, the client may edit the object by making changes to the server document. When the object is embedded from the server document to the container document, the user may edit the object inside the container document by accessing features of the server document's application.

The preferred objects of the invention are "classes" and "servlets" that are part of Java (a trademark of Sun Corporation) programming language developed by Sun Microsystems, Inc. in Mountain View, Calif. Sun defines Java as a simple, object-oriented, distributed, interpreted, robust, secure, architecture neutral, portable, high-performance, multi-threaded, dynamic, general purpose programing language. Java supports programming for the Internet in the form of these objects. These objects execute within the server 110 and determine which Web-based page is to be served to the client 150. By using standard hypertext markup language (HTML) syntax for Web-based pages, standard communications protocol (HTTP) supported by the world wide web (WWW), and application server software such as IBM's WebSphere and HTTP Server, the Web browser at the client's workstation 150 that can communicate directly with the server 110. By using the above language, syntax, protocol and software, a Web application environment is established.

In particular, the browser installed on the client's workstation 150 is used to display and edit RIF content being generated when using the invention. The RIF includes references to and information about the technical data (that consist of design data, and test data), and design preparation instructions. When using a Web application environment, data is exchanged between the MM server 110 and the workstation 150. The RIF data can be reviewed and edited at the client's workstation 150 by Java code, JavaScript, and JavaServer pages as provided by the server 110.

Figure 1:
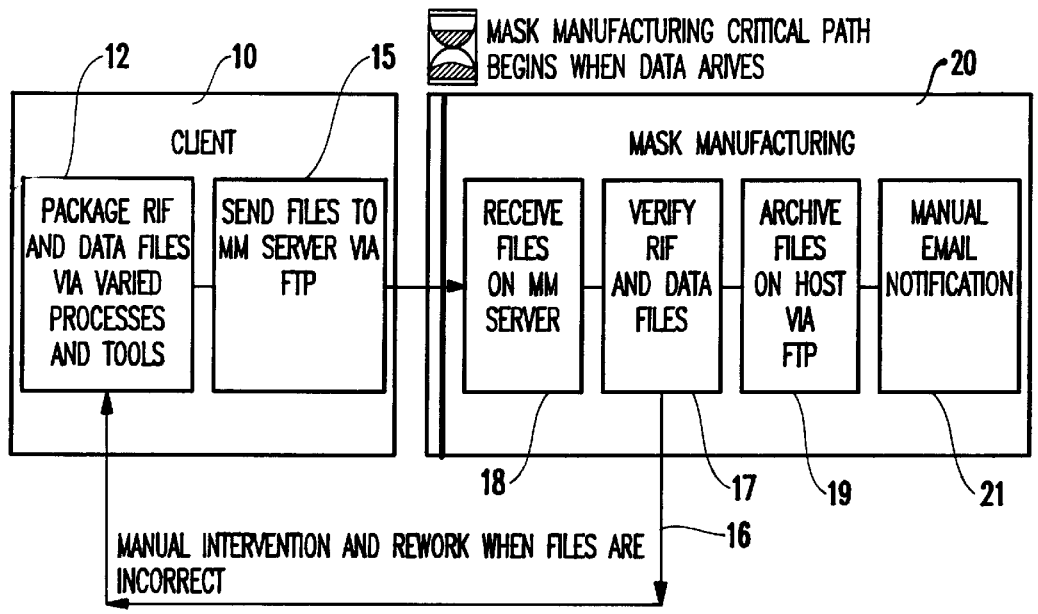
FIG. 1 shows a known method for a final tapeout process used in mask preparation for IC-semiconductor manufacturing.
Figure 3A:
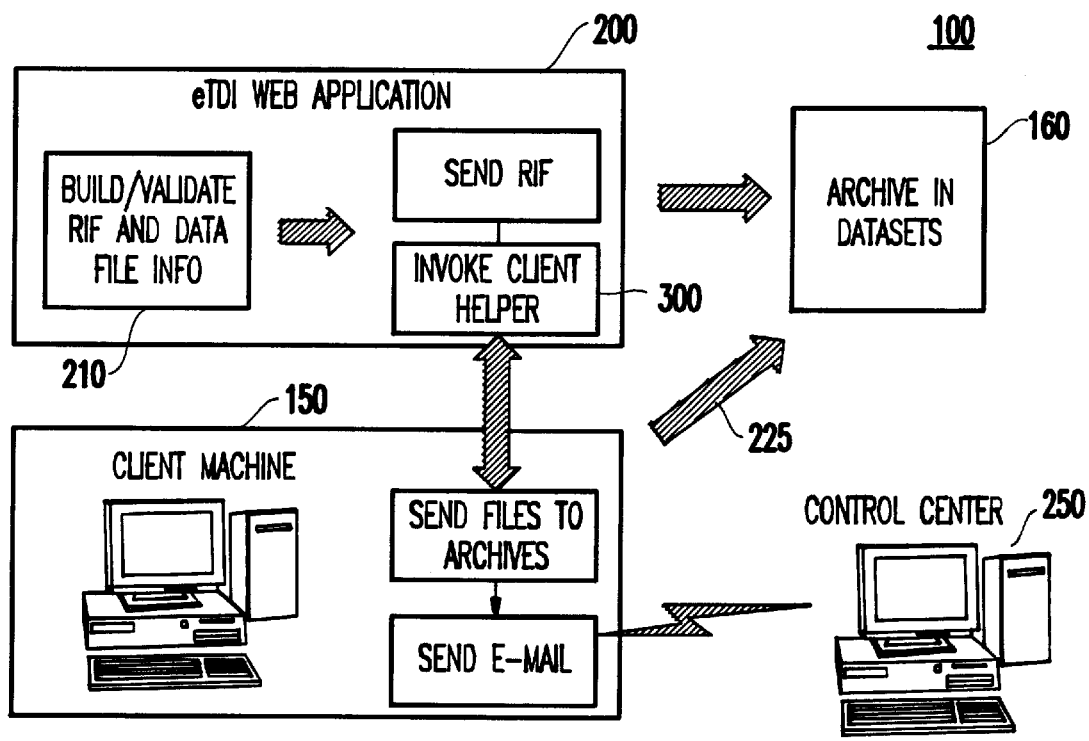
FIG. 3a shows pertinent technical data flow according to the invention.
Figure 3B:
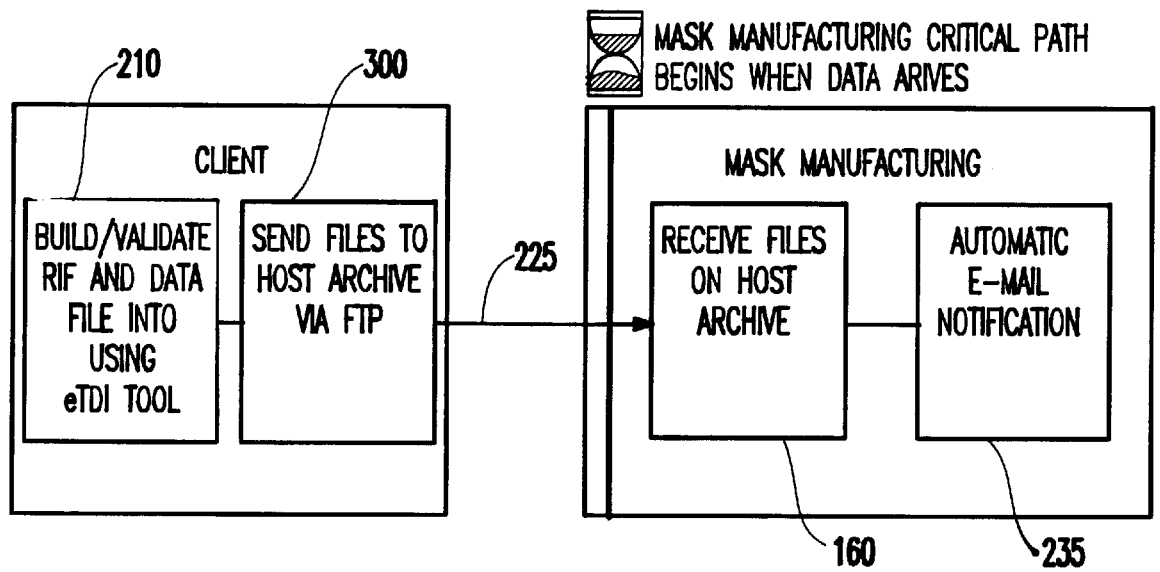
FIG. 3b shows an overall view of the tapeout file process according to the invention.
Figure 4:
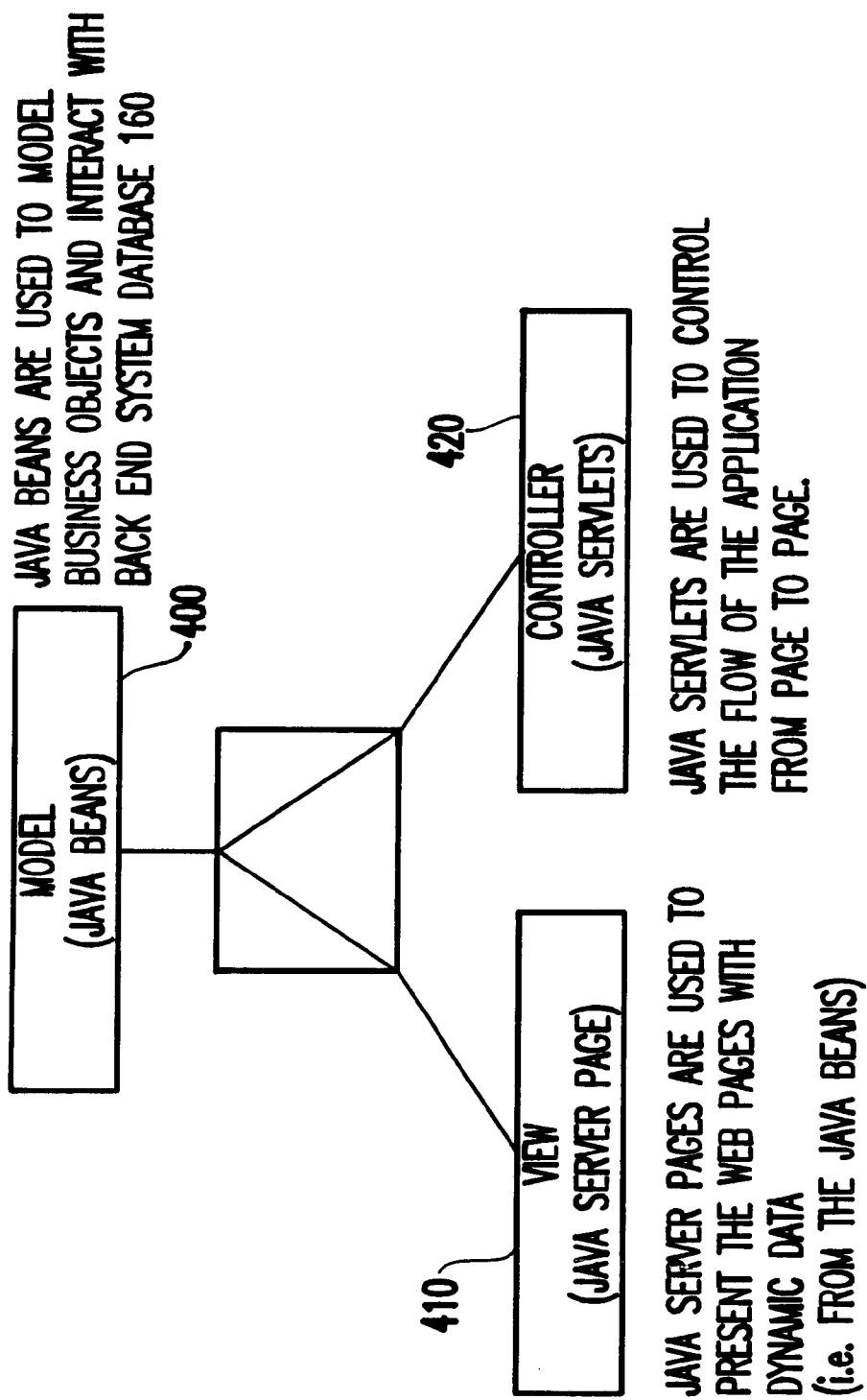
FIG. 4 shows the Java architecture of the method according to the invention.
Figure 5B:
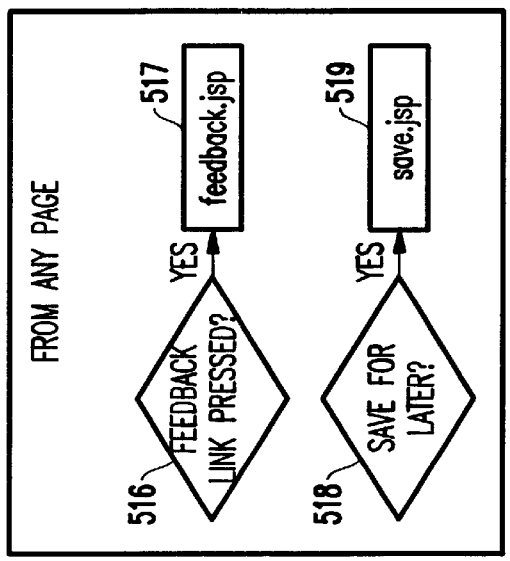
FIGS. 5a and 5b show flow diagrams of web pages sent by the MM server to a client's workstation.
Figure 5A:
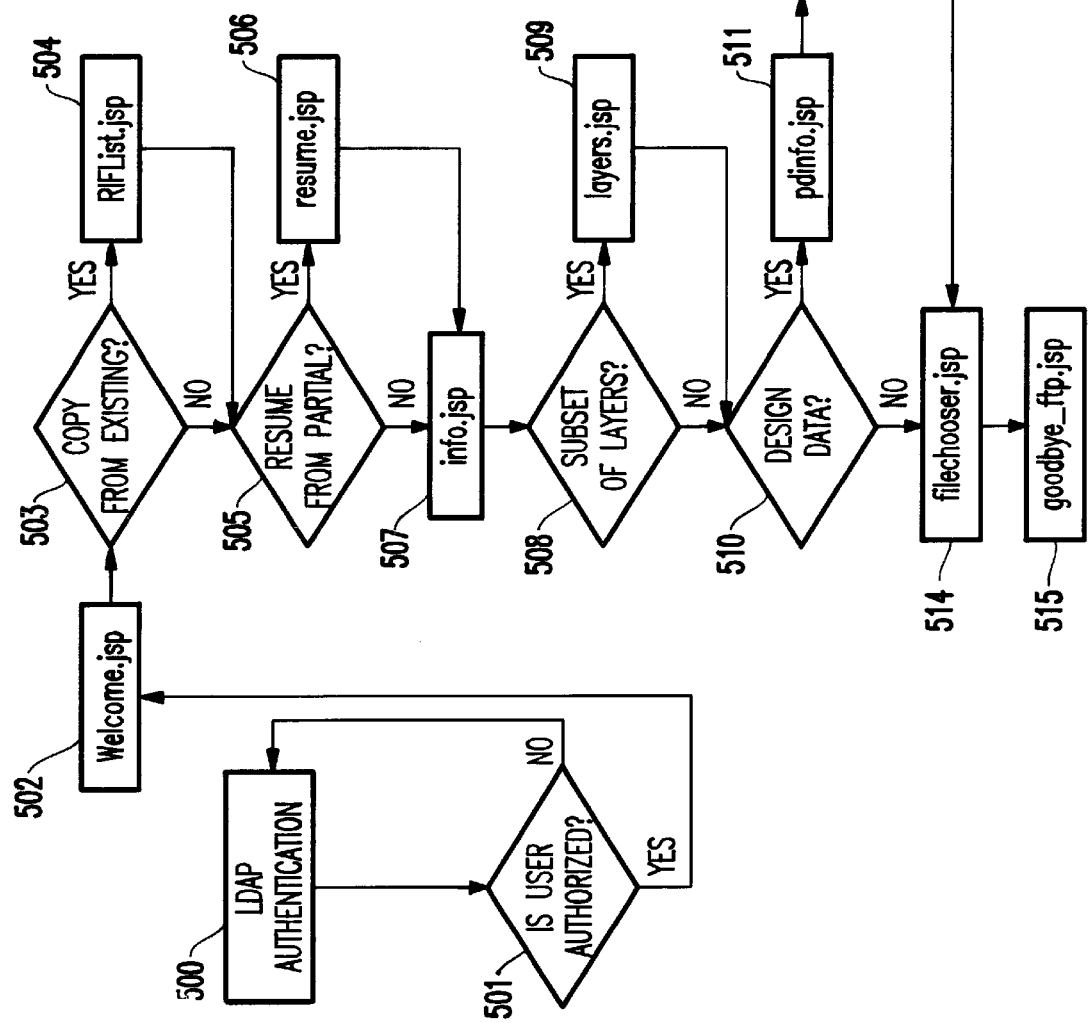

As shown in FIGS. 3a, 3b and 4, the electronic technical data interface (eTDI) application 200 is shown and is preferably implemented by JAVA programming language. In FIG. 3a, the client builds and validates the tapeout file (RIF) 210 by initially using information gathered from the server 110 using JAVA Beans 400. Java Beans is a component software architecture used in Java that can run remotely and independently as a discrete software application object in a distributed computing environment using a remote invocation method protocol of Sun Computers, Inc. It can be either a component or an object. Information components forming part of the invention are packaged and then distributed as independent Java Bean components. These Beans can include queries to a database. JavaServer pages 410 are used to display the contents of the Java Beans. Java Servlets 420 are used to control the progression of the application from page to page as shown in FIGS. 5a and 5b. FIG. 3b, (the invention is shown for comparison with FIG. 1) shows the elimination of the iterative processing step of manual intervention and rework when the files are incorrect. Further, the generation of an acknowledgment e-mail 235 is optionally generated by the invention. These JavaServer pages 410 create and send the web pages to the client workstation 150 from the server 110 as modeled business objects that interact with other data processing components in the network 100 as shown in FIG. 2, such as the archival storage database 160 where archival IC data is contained, or a server directory 180 or where authorized client data is stored. Discussion as to how Java Beans are implemented and used is disclosed in U.S. Pat. No. 6,161,107, which is hereby incorporated by reference.

FIG. 5*a* shows a flow diagram of the eTDI application 200 using the workstation's browser. The application 200 operational platform is independent of the client's workstation, requiring only the Web browser loaded on the workstation 150. The application 200 can be executed by the workstation from the MM server 110. At final stages of completion of the process of application 200, the MM server 110 sends the final form of the RIF file to the archival server 130 which stores it in the archival IC database 160. Also, a sub-application known as a "helper application" 300 running on the client workstation is used to send the IC design technical data, referenced in the RIF, to the archival server 130 which stores it in the archival IC database 160. Properties for these JavaServer pages asp) in the process flow diagram of the eTDI application 200 are as follows:

The archival IC database 160 is also used as the IC reference library that provides the client, through the application, with only valid design options for an IC design. Java Beans are used to execute queries of the tables in database 160. Results from the queries are stored on the server 110 with the context of the Java Bean. This specified reference data within the Java Bean is used by the jsp at the client's browser to create a selection list with only valid values for a particular data list field.

When using the eTDI application 200, the client has options of clicking either a "reset entries," "save for later," "previous" or "next" page button on each of the j sp. Each page, as presented to the user, is sequentially advanced or regressed one page at a time. When the client clicks the "next" button, this action invokes a JavaScript validation process that ensures that the client has selected a valid option from a particular "select list" and that all entries must be entered prior to progressing to the next jsp. All of the jsp's (i.e., pages that appear in the browser) are used to gather and perform checking and validation on the data when entered into the application 200. If a requisite field on the page is not filled in with data by the client, then progression does not occur until completed by the client. The client cannot continue to the next jsp (the send function is the final step of the process) before all conflicts or omissions are resolved on each of the jsp.

The eTDI application 200 can save partially completed work (step 517), and resume (step 502) that same work at a later time. Each of the jsps store technical data that the client has entered in an instance of a RIFInfoBean. This bean is stored in the client's session on the MM server 110. The save action executes the SaveRifServlet which uses the RifWriter class to write information from the RIFInfoBean to a file stored on the server 110 file system. The client starts a save (step 517) by clicking the "Save for Later" button on the JavaServer pages.

The eTDI application 200 allows copying of previously submitted data, wherein modifications can be performed on only those pieces of information/data that have changed, thereby creating a new RIF. The client 150 can then send it.

The WelcomeServlet executes a RIFList.initialize method to build a list of RIF's that match the part number entered by the client on the Welcome.jsp (step 501). Previous RIF's are stored on the database 160. The client selects one RIF from the list that is desired to be copied and a next button executes the RIFListServlet which in turn instantiates a RIFInfoBean. The RIFInfoBean.set RIFInfo method retrieves information about a previous RIF from the database 160. Information is stored in the RIFInfoBean that is used to pre-fill fields on the application 200. The client then sees Servelet Pages defaulted with the previous RIF technical data.

The eTDI application 200 also has a client directory on the server 180 for web authentication and access control to the application 200 by entering a userid and password (step 500). This allows only authorized clients to proceed to Welcome.jsp at step 502, the beginning of the application, and allows them to create new RIFs, or copy or resume previously stored RIFs (steps 504, 506 and 507 respectively).

At the beginning of use of application 200, a Welcome.jsp home page (step 502) appears, where the client starts the process creating new, or copies, or resumes prior work on a RIF. The client can request to copy an existing RIF at step 503 where the client is presented with a list of RIFs on the RIFList.jsp at step 504 that match the part number entered on the Welcome.jsp at step 503. Likewise, the client can resume a previously started RIF at step 505 and is also presented with a list of RIFs on the Resume.jsp at step 506 that have been saved incompletely. Alternatively, the client can start a new RIF and is presented with Info j sp at step 507. If the client has either requested to copy or resume a previous RIF, the Info.jsp at step 507 is pre-filled with retrieved data, otherwise the input fields are blank. If the client has indicated that the IC data references a subset of layers at step 508, then the Layers jsp at step 509 is presented, where the client can indicate which layers are relevant. If the client indicates that IC design data is to be referenced in the RIF 510 then PDInfo.jsp is presented where the client can enter more information about the design data. If the client indicates that this is a RIF Only at step 512 (meaning that the IC technical design files have already been transmitted to the archival database 160), then the RIF itself is transmitted to the archival database 160 and the client is presented with goodbye jsp at step 513, ending the application. Alternatively, if the client indicates that this is not a RIF Only, or no IC design data are referenced, then FileChooser.jsp is presented at step 514. The client enters those files that are desired to be sent to the archival database 160 by clicking on a 'Send' icon in the GUI to indicate to the client's invention to submit the RIF. The goodbye_ftp.jsp window is then presented.

As shown in FIG. 5*b*, at any time within the application, but before clicking "Send" in the FileChooser.jsp window, the client has the ability to send feedback to the developers 516 or save the current RIF at step 518 for later processing. When the client wishes to send feedback, feedback.jsp at step 517 is presented that allows a user to type freeform text that is logged in a file for the developers to read. When the client wishes to save the RIF, all data entered into the RIF is stored in a file and the client is presented with Save.jsp at step 519 that shows the name of the file the RIF was stored in.

To illustrate an exemplary and preferred form of how eDTI application 200 operates as to sending technical data to a mask manufacturer, an initial home page at step 502 is presented as the first screen to the user upon entering the eTDI website.

There are three paths to choose from the welcome.jsp at step 502: to copy a previously submitted RIF, to resume work on a partially completed RIF, or to start from a blank RIF. For the purpose of this example, initially start with a blank RIF. If the browser is configured properly, then the next screen is the info.jsp at step 507 that provides a GUI page for entering information about the data.

Next, the user provides information regarding his request and the data that he is submitting. The required information must be provided in the fields which are adjacent to field labels. When scrolling through this info.jsp, all of the information that is required is presented on this GUI page. The request for services (RFS) number is required to associate the data with a "Request For Services". This requirement ensures that no data is sent to the mask manufacturer without contracting for the services prior to the send. Company name and technical contact information are required so that the mask manufacturer can contact the sender in the event there are further questions or concerns regarding the data being sent. "Design Release Type" indicates for which layers design data and/or information is being sent. If "SUBSET" is chosen for the design release type, then additional information is required in order to inform the mask manufacturer as to specifically which layers (i.e., By layer name, as we will see later) are included. Also, depending on the design release type, either a (Front End Of Line) FEOL and/or (back end of line) BEOL chip part number must be provided. For example, if (FEOL) is chosen for design release type, then a FEOL chip part number must be provided. If BEOL is chosen for design release type, then a BEOL chip part number must be provided. If ALL-RIT AB is chosen, then both FEOL and BEOL chip part numbers are required, and if either ALL-SINGLE PN or SUBSET is chosen, then either a FEOL or a BEOL chip part number is required. A technology name must be provided because many of the manufacturing process information is technology name based. The design data submission YES/NO questions are required because they affect whether or not the user will be required to answer more questions (on subsequent screens) regarding the data being sent.

If the user attempts to click on the next button, but has not provided information in the required fields or the information does not pass these checks, then a pop-up screen is shown with a message indicating which piece of information is missing (e.g. RFS number, design release type, technology, etc). The info.jsp GUI screen continues to be presented until all of the information is correct. Once the information is correct, and the user clicks on the next button, the next screen is presented. The next screen presented depends on how the questions were answered on the info.jsp GUI screen. If the user selected a design release type of "SUBSET", then the layers jsp screen is presented next. If the user selected a technology which is currently supported by the mask manufacturer, then the layers.jsp GUI screen at step 509 is presented with a list of valid layer names for the technology selected.

In this case, the user then selects the layers to be included in this submission (one at a time, or multiply) from the box on the GUI screen, and clicks on a "Add" button. This action adds the selected layers from the box on the left to the box on the right. If the user attempts to add a layer to the box on the right, which is already in the list in this box, then an error message is presented, and the operation is not performed. The user can remove any or all layers from the box on the right using a "remove and remove all" buttons on the GUI page. Once an accurate list of layers to be included is in this submission, the user then clicks on the next button to go to the next screen. If there are no layers in the box on the right, then an error message is presented, and the user is not permitted to continue to the next screen. In the case where the user selected a technology which is not supported by the mask manufacturer, then the layers.jsp GUI screen is presented to the user with only a field on the left side of the screen, where the user must type in the layer names.

Again, the user is permitted to continue to the next screen (upon clicking on the next button) only if at least one layer name is present in the box on the right of the screen. If the user answered "YES" to the question "Is design data included in this submission?" on the info.jsp, then the next GUI screen presented is the pdinfo.jsp as a GUI screen at thestep 511.

All of the information required on the pdinfo.jsp pertains to design data. This GUI screen includes "Is this a RIF-only submission?" message which indicates whether or not the information being provided is for a design that already exists in the mask manufacturer's archives at step 512. If the data already exists, then it does not have to be retransmitted (re-FTPed) to the archives 160. The screen can also include the question "Does this data complete the order?" which indicates to the mask manufacturer that the order is now complete and manufacturing can begin. On the screen the question "Is this data an original submission or replacing existing data for a previous submission?" lets the mask manufacturer know whether rework is required for the previous submission. Further, on the screen will appear the question "Design Prep Required?" (DPR) and answered either "YES" or "ONLY". Then a DPREP GUI screen is provided in that field. The design information section of this screen includes parameters related specifically to the design data being sent. Design grid numerator and design grid denominator must be valid non-zero numerics. Negative numbers for these values are also not permitted. One of the three fields "TPRS Order Information", "Mask EC/SO Information", or "REA Information" must contain at least one number so that the data being submitted can be tied to a previously submitted order at the mask manufacturing site. Checks for all of these conditions are performed when the user clicks on the Next button on the GUI screen. As on other screens, if any of the checks fail, then an error message is presented and the pdinfo.jsp GUI screen continues to be presented to the user until the proper changes are made and all conditions are satisfied. Once these conditions are satisfied, (they are checked each time the user clicks on the next button) then the next GUI screen is presented. If the user answered NO to "Is this a RIF-only submission?" question, then the next GUI screen is the filechooser.jsp GUI at step 514.

The user can either type in the names of the files he wishes to send in the field provided, or use the browser button which allows him to navigate through the directory trees on the drives on his workstation. Once the file has been typed into the field (or selected via the browser button), the user clicks on an "add" button to add them to the list. If the user answered "YES" to the question "Is this a RIF-only send?" on the pdinfo.jsp GUI screen, then it is not necessary to add any file names on this GUI screen. However, if this is not a "RIF-Only" send-type data transmission, then at least one file must be added. Once the list is complete and accurate, the user then clicks the send button and a subsequent goodbye GUI screen appears (step 515).

As shown in FIG. 5*b*, saving and resuming a submission can occur at any point within the process of creating a data submission, using the TDI application 200 when using either the info.jsp, layers.jsp, pdinfo.jsp, or filechooser.jsp, the user can decide to save the work so that it may be resumed at a later time. In this case, the user simply has to click on the save for later button at the bottom of any of these GUI screens. When the save for later button at step 518 is clicked, the user is presented with a GUI screen at step 519. The contrasted file name is the file (on the server) in which the user's submission information (RIF) is stored.

At a later time, when the user wishes to resume work on the saved submission (or RIF), one must choose another button on the Welcome homepage screen, as to the text "Resume from a previously saved RIF" at step 505. When this Start button is clicked, the user is presented with the GUI screen at step 506.

From this screen, the user must select the file to resume, and then click on the next button. The user will then be presented with the info jsp screen, wherein all of the data that had previously been entered or selected is already completed on all of the screens. Then, the user continues to navigate through the screens, via the next button, and continues to enter remaining data to be entered, or change any data that has been previously entered.

The user can also choose to copy all of the information from a previous submission to use as a basis for a new submission. This is done by the user entering either a FEOL part number and/or a BEOL part number on the welcome home page screen, and then clicking on the start button. The FEOL and/or BEOL part number(s) entered can be used as search criteria for locating RIF information in the mask manufacturer's databases. The user will be presented, via the RIFlist.jsp GUI screen at step 504, with a list of all previously submitted RIFs for the FEOL and/or BEOL part numbers entered on the Welcome GUI home page screen.

From the RIFlist.jsp GUI screen at step 504, the user can either select a RIF from the list to use as a basis for the new submission, or search again using different FEOL and/or BEOL part numbers. If the user clicks on a new search button, the RIFlist.jsp at step 504 will be displayed again, only the list contents will reflect the results of the new search. Once the user selects a RIF from the list, and clicks on the next button, the submission process will begin at the info.jsp. However, all of the data fields and selections on all of the screens will be filled in with the information supplied in the selected (i.e. previously sent) RIF. The user can then continue to navigate through the screens, via the next button, and continue to enter the remaining data, or change any data previously entered.

Although eTDI application 200 was developed specifically for IBM Mask Manufacturing, it can be readily modified for use by any semiconductor mask manufacturer. Any customization necessary could be accomplished by modifying the Web GUI screen content and database tables.

Upon completion of the RIF at the goodbye GUI screen (step 515), which has been validated for completeness and accuracy, it is written to a file and sent to the archival database 160 for storage via FTP. Likewise, the contents of the RIF are written to another file in the format of a Java properties file. The application invokes this file as a URL which causes the browser to launch the client "helper" application 300 which sends the IC technical design files to the archival database 160, via FTP, and sends an appropriate e-mail. The helper application 300 has the ability to send very large files (i.e., greater than 2 gigabytes) from any client workstation 150 to the archive database 160. The properties file is created by a FilechooserServlet, which is called after the client 150 has listed the IC technical design files to be sent, and then clicking "Send."

The properties file is written as plain text by the FileChooserServlet line by line. Exemplary code for this servlet function is as follows:

```
FileChooserServlet.java:
String tdiFileName = new String( ):
String tdiFileNameAndDir = new String( ):
   tdiFileName = rifInfo.getPartid+ ".D + rifInfo.getDate( ) + ".T + rifInfo.getTime( ) + ".tdi";
   tdiFileNameAndDir = System.getProperty("tdiCreateDir") + tdiFileName;
   File tdiFile = new File(tdiFileNameAndDir);
   FileOutputStream fout = new FileOutputStream(tdiFileNameAndDir);
   PrintWriter pout = new Print Writer(fout);
     pout.println("VERSION=" + System.getProperty("FTPapp.Version"));
     pout.println("STILLRUNWITHOLDVERSION=" +
System.getProperty("FTPapp.StillRunWithOldVersion"));
     Integer Inum Version Length = new
Integer(System.getProperty("FTPapp.NewVersionMessageLength"));
         poutprintln("NEWMESSAGELENGTH=" + InumVersionLength.toString( ));
         for(int iLineNum =1; iLineNum<= Inum VersionLength.intValue( ); iLineNum++) -
           pout.println("NEWVERSIONMESSAGE" + iLineNum + "=" +
System.getproperty("FTPapp.NewVersionMessage" + iLineNum));
-
     pout.println("MVSHOST=" + System.getProperty("HostName"));
     pout.println("PARTID=" + rifInfo.getPartid( );
     pout.println("MAILID=" + System.getProperty("Mail.From.Default"));
     pout.println("MAILHOST=" + System.getProperty("Mail.Server.Default"));
```

An exemplary section of the generated properties file appears as follows:
Properties File:
VERSION=1.0
STILLRUNWITHOLDVERSION=true
NEWMESSAGELENGTH=1
NEWVERSIONMESSAGE1=Please update to version 1.1 of this tool!
MVSHOST=BTVLABA.BTVJIBM.COM
PARTID=12K3456
MAILID—etdigbtv.ibm.com
MAILHOST=mailrelay.btv.ibin.com
NUMERRORCONTACTS=1
ERRORCONTACT1=CSYAGER@US.IEM.COM
NUMSUCCESSCONTACTS=2
SUCCESSCONTACT1=RTMC@US.IBM.COM
SUCCESSCONTACT2=CSYAGER@US.IBM.COM
NUMFPILES=1

FILE1.FILENAME=/local/rnydesigns/12
  k3456.tmd.test.txt.z
FILE1.NAMEONHOST=
  CPRODREC.TEST.L12K3456.TMD.D000907.T1023
FILE1.RECFM=VB
FILE1LRECL=120
FILE1.BLKSIZE=27998
FILE1.DATAFORMAT=ASCII
FILE1.SECONDARY=50

An initial setup of the eTDI application 200 is needed to configure the browser. This configuration allows the browser to recognize the properties file name as being special and thereby executes the "helper" application. The application 200 detects if the client workstation needs to do this and will not let the client 150 continue using the application 200 until the browser is set up properly. For a Windows NT-based client, this setup is done automatically when installing the helper application 300 that can be downloaded from the MM server 110.

print "type=application/eTDI\">>$filename1
print "exts=\"tdi\"\">>$filename1
print "desc=\"eTDI Application\"">>$filename1

Once this script is executed, the browser is set up to automatically use the properties file. By using the client workstation 150 with the configured the browser, when the "Send" button is clicked on the FileChooser.jsp 514, the properties file is created. The FilechooserServlet (step 514) then calls the properties file as if it were an HTML, page. The browser then recognizes the properties file, executes the helper application 300, and downloads the properties file to the helper application 300. The helper application reads the properties file and sends the IC technical data files. This action completes the tapeout process (step 515). After the technical data files are sent, an acknowledgment e-mail can be sent to any specified recipient in the properties file. Here is code for the helper application:

```
FTPapp.java (section retrieving some info from properties file):
//SET PROPERTIES FOR, AND SEND, EACH FILE
Integer numFiles = new lnteger(System.getProperty("NUMFILES"));
successfulFileSend = new boolean[numFiles.intValue( )];
for (int curFile =1; curFile <= numFiles.intValue( ); curFile++) -
        try -
        //RETRIEVE VALUES FOR SETTINGS
        String recfm = System.getProperty("FILE" + curFile + ".RECFM").trim( );
        String lrecl = System.getProperty("FILE" + curFile + ".LRECL").trirn( );
                StringsendType = System.getProperly("FILE" + curFile +
".DATAFORMAT").trim( );
        String blockSize = System.getProperty("FILE" + curFile + .BLKSIZE").trim( );
        String fileToSend = System.getProperty("FILE" + curFile
+".FILENAME").trim( );
        String nameOnHost = System.getProperty("FILE" + curFile +
".NAMEONHOST").trim( );
FTPapp. Java (section setting FTP values and send files):
    10   //SEND SETTINGS VALUES
FtpProtocol.site("autorecall");
        ftpProtocol.site("recfm=" + recfm + "lrecl=" + lrecl + "blksize=" + blockSize);
        ftpProtocol.site("unit=" + unit + "pri=" + primary + "sec=" + secondary);
ftpProtocol.site("dataclass=" + dataclass);
FtpProtocol.setType(sendType);
        // SEND FILES
ftpProtocol.putFile(fileToSend, "\"" + nameOnHost + "\"");
if (ftpProtocol.hasErrorOccurred( )) -
        printText("Unable to send file: "+FileToSend + ".\r\n");
successfulFileSend[curFile – 1] = false;
boolErrorInSubmission = true;
-
else - successfulFileSend[curFile – 1] true;
-
```

Script code for this function is as follows:

filename1="$HOME/.mime.types"
filename2="$HOME/.mailcap"
/usr/bin/sed '/type=application-eTDI/d' $filename 1>tempe-
  file 1
/usr/bin/sed '/exts="tdi"/d' tempfile1>tempfile2
/usr/bin/sed '/desc="eTDI Application"/d' tempfile2>$filename1
/usr/bin/rm tempfile1
/usr/bin/rm tempfile2
/usr/bin/sed '/application"-eTDI/d' $filename2>file2
/usr/bin/mv file 2 $filename2
if not delete option then add new lines otherwise leave Netscape files empty.
if [[$1!="-d"]]; then
print "Adding new information to Netscape files . . . "

Use of the eTDI application 200 allows for using FTP protocol to specify a multi-volume file sending capabilities using a dataclass created on the server 110.
Code from FTPapp.java:
FtpProtocolsite("autorecall");
ftpProtocol.site("recfm="+recfm+"1rec1="+1rec1+ "blksize="+blockSize);
ftpProtocol.site("unit="+unit+"pri="+primary+"sec="+ secondary);
ftpProtocolsite("dataclass="+dataclass);
flpProtocol.setType(sendType);

Although the invention is intended for use by a semiconductor manufacturer, it has utility in other applications where detailed, accurate and complete technical data is a critical step in the processing. The invention satisfies a need for receiving technical data (i.e., design data, test data, etc.) during the final tapeout process prior to mask fabrication. The invention does this by providing a platform-independent eTDI application 200 to perform this task. The invention saves time and money by reducing overall turn-around time in the critical design paths. With the invention, the client's tapeout file is consistent, accurate, and repeatable for any IC chip design.

In addition, the invention includes commands for transmitting files larger than two-gigabytes without manual intervention, allowing the remote workstation to send files automatically. In preferred form, the invention is a Web based tool, which requires only a web browser and small downloadable "helper" application 300. The invention also has the "correct by construction data validation process", and reduces repetitive data processing that minimize data errors caused by manual intervention, reduce client workload, and improve cycle time. Moreover, the invention includes client authentication feature that ensures that only the application 200 is used for submitting technical data by authorized clients, resulting in consistent, accurate and repeatable tapeout process. Also, by using standardized reference tables located in an archival database 160 linked to the server 110 of the MM, only valid options are available to the client. Other features of the invention, as presented above, include the ability to save and resume work that is partially completed on any one chip design by the client. Yet another feature includes the ability to copy previously submitted technical data, and modify only those pieces of information that have changed, then resending it as a new RIF. Once the design is validated at completion of the eTDI application 200, all the information is placed in a "properties" file, causing the browser to launch the helper application 300 to transmit files, via FTP, to the mask manufacturer archival database.

While the invention has been described in terms of preferred embodiments, those skilled in the art will recognize that the invention can be practiced with modification within the scope of the appended claims.

What is claimed is:

1. A method for generating an integrated circuit (IC) tapeout file over a computing network, said method comprising:
   prompting IC technical data from a client workstation;
   automatically, and without user intervention, validating that said IC technical data is complete; and
   automatically, and without user intervention, generating said IC tapeout file at completion,
   wherein said IC tapeout file comprises IC design technical data and a text document containing information and instructions pertaining to said IC design technical data.

2. The method of claim 1, further comprising sending said tapeout file from said workstation to an archival data base.

3. The method of claim 1, wherein said technical data includes selecting part numbers, subset layer number/names and release types of said IC design.

4. The method of claim 3, further comprising saving a partially complete IC technical data file prior to completing said method.

5. The method of claim 4, further comprising resuming processing after saving said partially complete file.

6. The method of claim 4, further comprising copying of a previously sent IC_release information file_(RIF).

7. The method of claim 1, further comprising authenticating said user prior to transmitting said IC tapeout file on said network thereby verifying that said server is authorized to communicate with said workstation.

8. The method of claim 1, wherein said generating of said IC tapeout file at completion comprises creating a properties file and transmitting said tapeout file over said network from said workstation to an archival database.

9. The method of claim 8, wherein said generating of said tapeout file includes sending an acknowledgment electronic mail to a recipient in said properties file.

10. The method of claim 1, wherein said method is operated by a browser application operating on said workstation that communicates with a server under an HTTP protocol.

11. A method for generating an integrated circuit (IC) tapeout file from a workstation through a remote mask manufacturer server, where said tapeout file is generated in a browser of said workstation, said method comprising:
    prompting IC technical data from a client at said workstation;
    automatically, and without user intervention, validating that said IC technical data is complete; and
    automatically, and without user intervention, generating said IC tapeout file at completion,
    wherein said IC tapeout file comprises IC design technical data and a text document containing information and instructions pertaining to said IC design technical data.

12. The method of claim 11, further comprising sending said tapeout file from said workstation to an archival data base.

13. The method of claim 11, wherein said technical data includes selecting part numbers, subset layer number/names and release types of said IC design.

14. The method of claim 13, further comprising saving a partially complete IC technical data file prior to completion.

15. The method of claim 14, further comprising resuming processing after saving said partially complete file.

16. The method of claim 14, further comprising copying of a previously sent IC_release information file (RIF).

17. The method of claim 11, further comprising authenticating said user prior to transmitting said IC tapeout file on said network thereby authorizing said server to communicate with said workstation.

18. The method of claim 11, wherein said generating of said IC tapeout file at completion comprises creating a properties file and transmitting said tapeout file over said network from said workstation to an archival database.

19. The method of claim 18, wherein said generating of said tapeout file includes sending an acknowledgment electronic mail to a recipient in said properties file.

20. The method of claim 11, wherein said method is operated by a browser communicates with said server under an HTTP protocol.

21. A system for generating an integrated circuit (IC) tapeout file over a computing network, said system comprising:
    at least one server;
    at least one client workstation operably connected to said server,
    wherein said workstation includes a browser application with a graphical user interface that communicates with said server, and wherein said browser is configured for prompting said client workstation for IC technical data, for automatically, and without user intervention, validating that said IC technical data is complete, and for automatically, and without user intervention, generating said IC tapeout file at completion,
    wherein said IC tapeout file comprises IC design technical data and a text document containing information and instructions pertaining to said IC design technical data.

22. The system of claim 21, wherein said network comprises one selected from a group consisting of an intranet, Internet, and extranet based network.

23. The system of claim 21, wherein said workstation is further configured for sending said tapeout file from said workstation to an archival database.

24. The system of claim 21, wherein said technical data includes selecting part numbers, subset layer number/names and release types of said IC design.

25. The system of claim 21, wherein said server authenticates said user prior to generating said tapeout file.

26. The system of claim 21, wherein said workstation includes a display for displaying information by said browser, and in which said prompting for said IC technical data includes validation of said tapeout file.

27. A computer program product for creation of an integrated circuit (IC) tapeout file by communications between a server and a workstation, said computer program product comprising:
   a computer usable medium having a computer readable program for causing the workstation to:
   prompt IC technical data from a client workstation;
   automatically, and without user intervention, vaildate that said IC technical data is complete; and
   automatically, and without user intervention, generate said IC tapeout file at completion,
   wherein said IC tapeout file comprises IC design technical data and a text document containing information and instructions pertaining to said IC design technical data.

28. The program of claim 27, further comprising sending said tapeout file from said workstation to an archival data base after generation of said tapeout file.

29. The program of claim 27, wherein said technical data includes selecting part numbers, subset layer number/names and release types of said IC design.

30. The program product of claim 27, further comprising authenticating said user prior to transmitting said IC tapeout file on said network thereby verifying that said server is authorized to communicate with said user.

31. The program product of claim 30, further comprising saving a partially complete IC technical data file prior to completing said method.

32. The program product of claim 31, further comprising resuming processing after saving said partially complete file.

33. The program product of claim 31, further comprising copying of a previously sent IC design file.

34. The program product of claim 27, wherein said generating of said IC tapeout file at completion comprises creating a properties file and transmitting said tapeout file over said network from said workstation to an archival database.

35. The program product of claim 34, wherein said generating of said tapeout file includes sending an acknowledgment electronic mail to a recipient in said properties file.

36. The program product of claim 27, wherein said method is operated by a browser application operating on said workstation that communicates with a server under an HTTP protocol.

* * * * *